United States Patent [19]
Wang

[11] Patent Number: 5,763,900
[45] Date of Patent: Jun. 9, 1998

[54] INFRARED TRANSCEIVER PACKAGE

[75] Inventor: Ling-Yu Wang, Taipei, Taiwan

[73] Assignee: Taiwan Liton Electronic Co. Ltd., Taipei, Taiwan

[21] Appl. No.: 760,521

[22] Filed: Dec. 5, 1996

[51] Int. Cl.$^6$ .......................... H01L 27/15; H01L 31/12; H01L 33/00
[52] U.S. Cl. .................. 257/81; 257/98; 257/100
[58] Field of Search ...................... 257/81, 98, 100

[56] References Cited

FOREIGN PATENT DOCUMENTS 2119187  5/1990  Japan .
3184383  8/1991  Japan .

*Primary Examiner*—Stephen Meier
*Attorney, Agent, or Firm*—Beveridge, DeGrandi, Weilacher & Young, LLP

[57] ABSTRACT

An infrared transceiver packaging hardware including a substrate, a plurality of infrared emitting and receiving elements (IC, photoelectric diode or transistor, contact pins) fastened to the substrate by a wire bonding technique, a shielding case covered on said substrate and connecting it to earth, and an insert mode die filled up with a bonding compound, the shielding case with the substrate being inserted into the bonding compound in the insert mode die, and then sealed with the bonding compound together through a backing process.

11 Claims, 10 Drawing Sheets

INFRARED TRANSCEIVER PACKAGE

BACKGROUND OF THE INVENTION

The present invention relates to an infrared transceiver packaging method which eliminates the interference of electromagnetic waves. The hardware of the invention includes a substrate mounted with infrared emitting and receiving elements, and a shielding case mounted on the substrate and inserted with it into a bonding compound in an insert mode die. The bonding compound is sealed to the shielding case and the substrate through a backing process.

Various infrared transceiver packaging methods have been disclosed for the production of a variety of remote controllers, that prohibit electromagnetic interference.

FIGS. 4 and 5 show an infrared transceiver packaging hardware and flow chart according to the prior art. This method includes the steps of:

1. covering a layer of an adhesive over a printed circuit board;
2. mounting a chip resistor, capacitor, IC, etc. on the printed circuit board;
3. baking the printed circuit board to harden the adhesive;
4. installing a photoelectric diode, and contact pins;
5. sending the device to an automatic welding and stove for welding;
6. mounting a metal shield and connecting it to a ground, and then covering the metal shield with a metal cover.

During packaging, the well-packed IC 41, photoelectric diode 42, chip elements 43 and contact pins 49 are adhered to the printed circuit board 40 by electrically conductive material, then the printed circuit board 40 is mounted in the metal shield 46, and then a metal cover 52 is covered over the metal shield 46. This method is simple, and requires less installation cost. However the finished product is heavy, and the material cost of the finished product is high.

FIG. 6 shows another prior art packaging method according to U.S. Pat. No. 5,350,943, issued to TFK Germany. The shielding shell has a substantially U-shaped profile, and is foldable. The wavelength of the emitter according to this packaging method is about 1100 nm, and the lower limit of the cut-off wavelength is about 800 nm. This packaging method is complicated to perform. The lead wire frame limits the direction of the connection of the related elements.

FIGS. 7 and 8 show another infrared transceiver packaging hardware and flow chart according to the prior art. This method includes the steps of:

1. selecting suitable components and adhering them to a substrate (rack or frame);
2. wire bonding the IC and photoelectric diode;
3. molding a bonding compound on the substrate by a molding machine;
4. separating the product thus obtained into a single device by punching; and
5. covering the product thus obtained with a metal shield to obtain a finished product is obtained.

During packaging, the IC 41, photoelectric diode 42, etc., are fastened to the printed circuit board 40 by electrically conductive material 45, then are wire bonded the wires 44, and then a bonding compound 47 is molded on the device. The molded object is then fastened in a metal shield 46, and thus a finished product is obtained.

FIGS. 9 and 10 show still another infrared transceiver packaging hardware and flow chart according to the prior art. This method includes the steps of:

1. selecting suitable components and adhering them to a printed circuit board;
2. wire bonding the IC and photoelectric diode;
3. pouring a bonding compound onto the substrate over the elements thereon, then baking the device;
4. mounting and welding the resistor, capacitor and other components; and
5. mounting the semi-finished product thus obtained in a metal shield, and then covering the metal shield with a metal cover; to obtain a finished product.

During packaging, the IC 41, photoelectric diode 42, etc., are fastened to the printed circuit board 40 by electrically conductive material 45, then the wires 44 are soldered, and then a bonding compound is covered over the printed circuit board and over the related elements. Then chip elements 43, and electrolytic capacitor 48 are fastened to the printed circuit board 40 by electrically conductive material 45, and then the semi-finished product is covered with the metal shield 46 and the metal cover 52, so as to obtain a finished product.

SUMMARY OF THE INVENTION

According to the present invention, the infrared transceiver packaging hardware comprises a substrate, a plurality of infrared emitting and receiving elements (IC, photoelectric diode or transistor, contact pins, etc.) wire bonding to the substrate, a shielding case covering on said substrate and connecting it to a ground, and an insert mode die filled up with a bonding compound, the shielding case with the substrate being inserted into the bonding compound in the insert mode die, and then sealed with the bonding compound together through a backing process.

DETAILED DESCRIPTION OF THE PREFERRED EMBODIMENT

Figure 2:
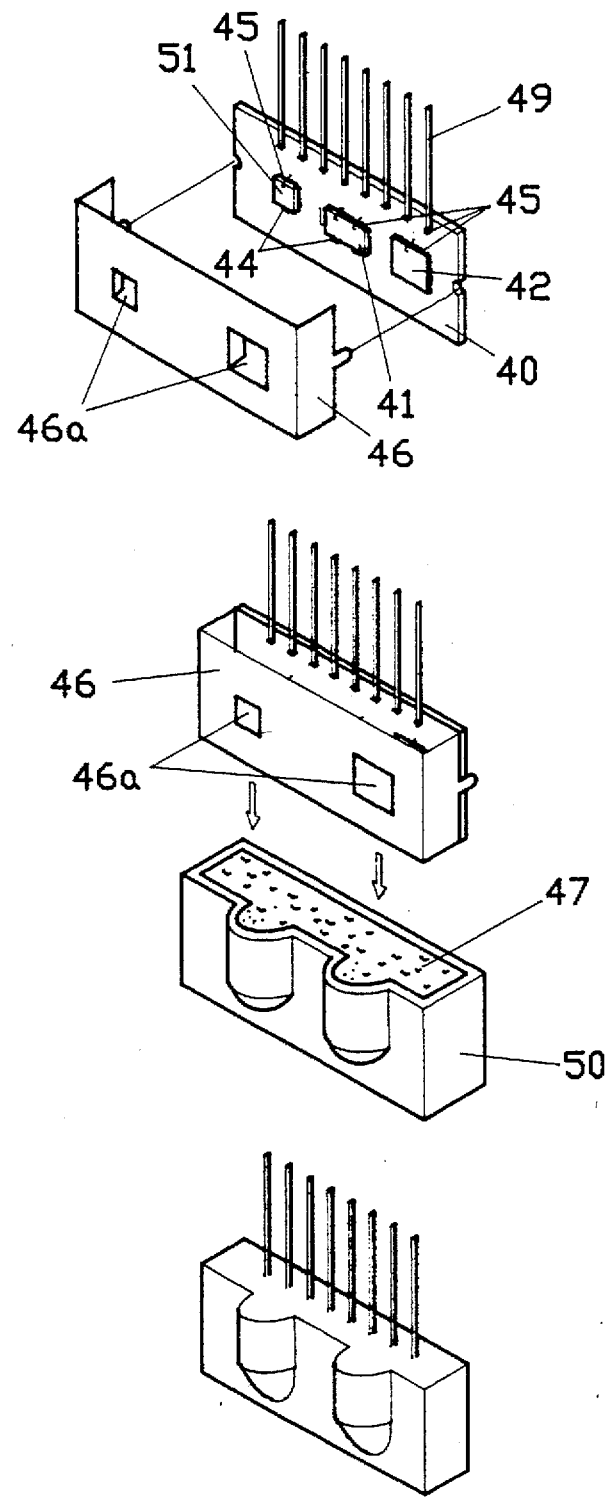
FIG. 2 is an infrared transceiver packaging flow chart according to the present invention.

Referring to FIG. 2, the hardware for an infrared transceiver packaging method in accordance with the present invention, is comprised of a substrate 40, a shielding case 46, and an insert mode die 50. The substrate 40 is mounted with an IC 41, a photoelectric element (photoelectric diode or transistor) 42, and a plurality of contact pins 49. The IC 41, the photoelectric element 42 and the contact pins 49 are fastened to the substrate 40 with electrically conductive material 45 by bonding. The substrate 40 can be made in the form of a rack, an open frame, or a printed circuit board. The shielding case 46 is mounted around the substrate 40, and has a window 46a. The insert mode die 50 is filled up with a bonding compound 47. When the substrate 40 is mounted in the shielding case 46, the shielding case 46 is plugged into the bonding compound 47 in the insert mode die 50, and then processed into a finished product by means of a baking and mold stripping process.

Figure 1:
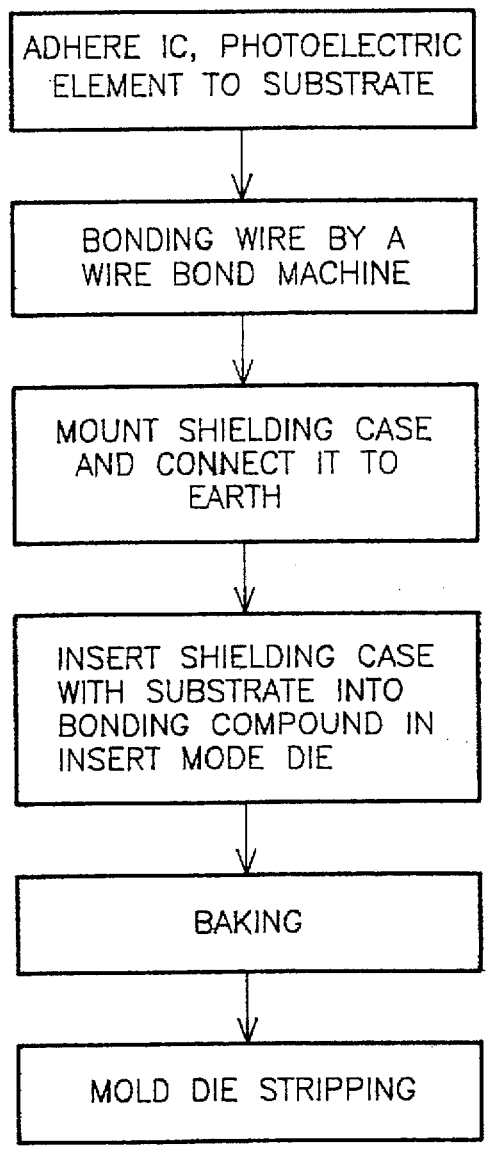
FIG. 1 diagram of an infrared transceiver packing method a the present invention.

Referring to FIG. 1 and FIG. 2 again, an infrared transceiver package packaging method, in accordance with the present invention, includes the steps of:

1. preparing an IC 41 and a photoelectric element 42, and adhering the prepared elements to a substrate 40;
2. performing wire bonding 44 through a high temperature baking oven and a wire bond machine;
3. mounting a shielding case 46 on the substrate 40, and connecting the shielding case to a ground;
4. inserting the substrate 40 into a bonding compound 47 in an insert mode die 50;
5. baking the insert mode die 50 to harden the bonding compound 47; and
6. removing the hardened bonding compound 47 from the insert mode die 50.

Thus a finished product is obtained and insulated against the interference of electromagnetic waves.

The elements which are mounted on the substrate 40 can be installed by a surface mounting technique or non-surface mounting technique. The shielding case 46 is made with one window or two windows 46a for infrared transmitting and receiving.

Figure 3:
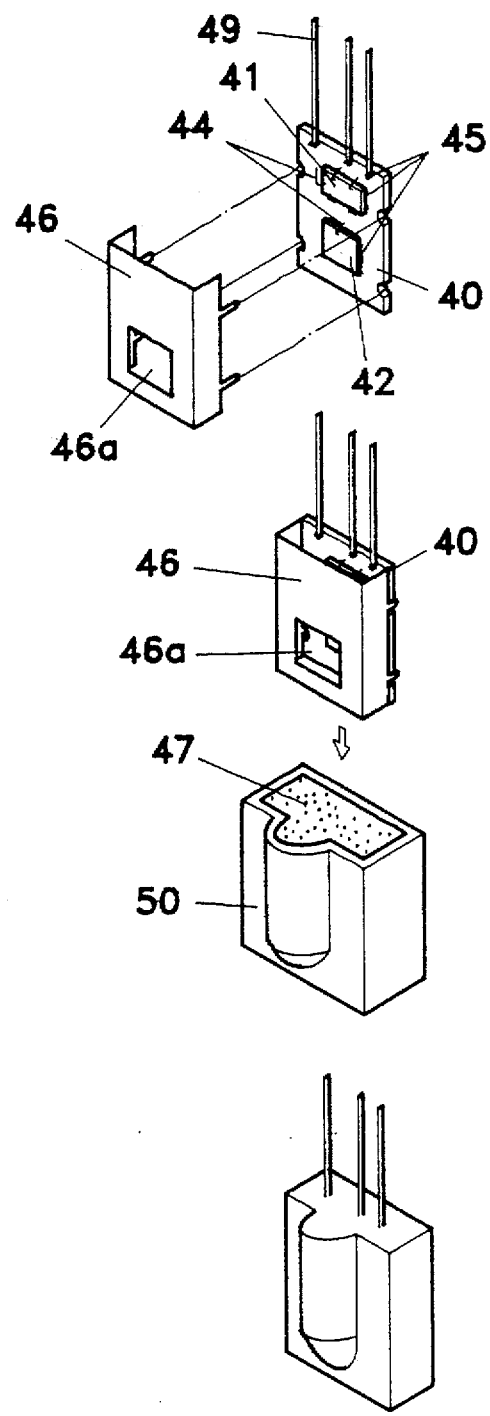
FIG. 3 is an alternate form of the infrared transceiver packaging flow art according to the present invention.
Figure 4:
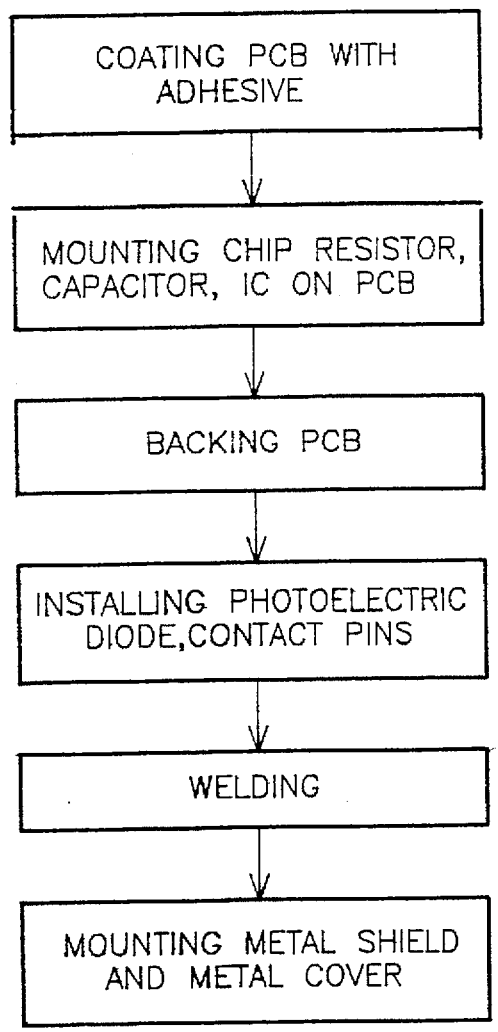
FIG. 4 is a block diagram of an infrared transceiver packing method according to the prior art.
Figure 5:
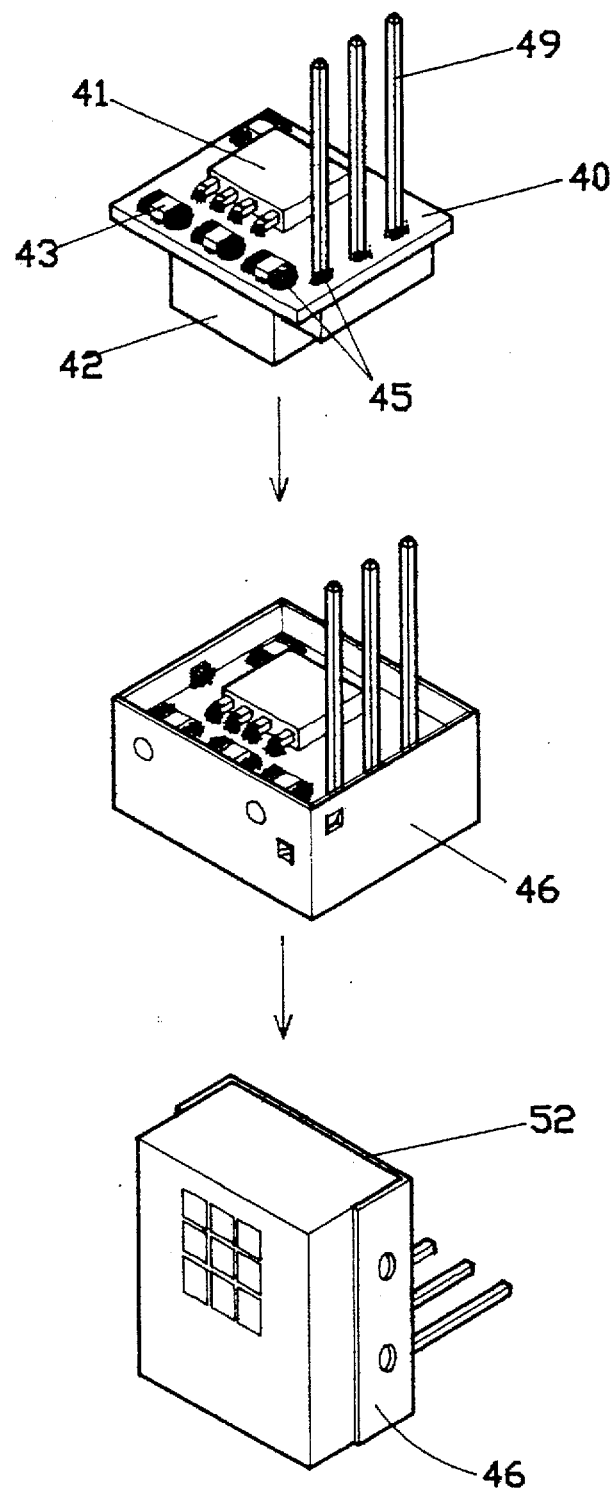
FIG. 5 is an infrared transceiver packaging flow chart according to the method of FIG. 4.
Figure 6:
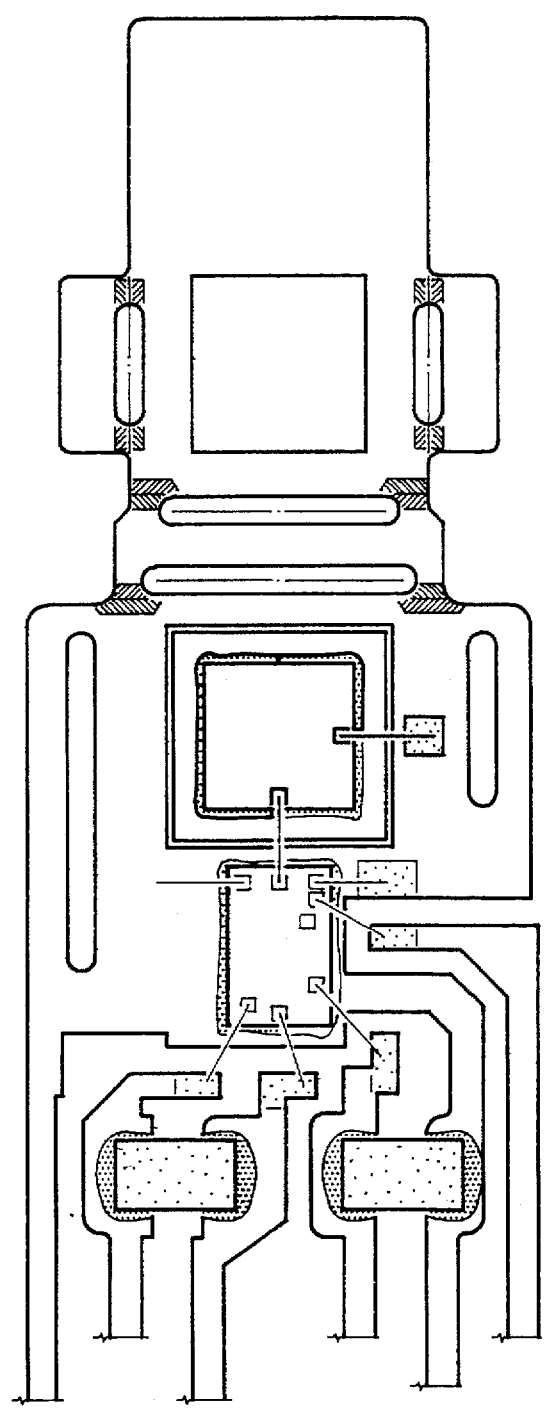
FIG. 6 is a plan view showing the infrared transceiver packaging according to U.S. Pat. No. 5,350,943.
Figure 7:
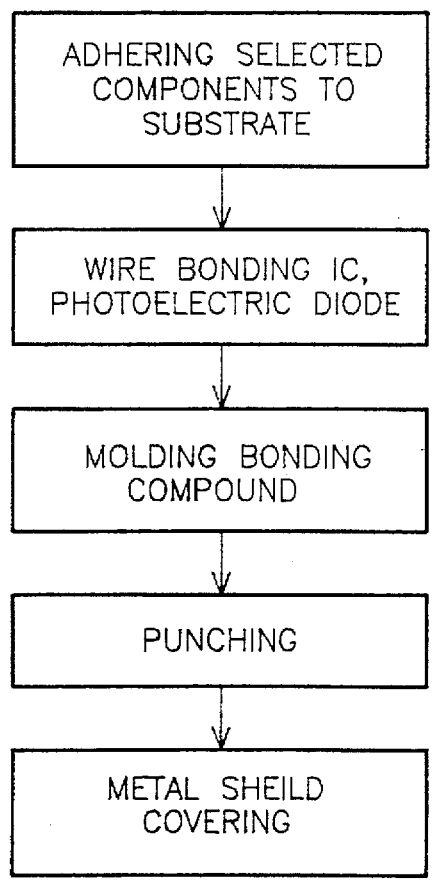
FIG. 7 is a block diagram showing another infrared transceiver packaging method from Sharp.
Figure 8:
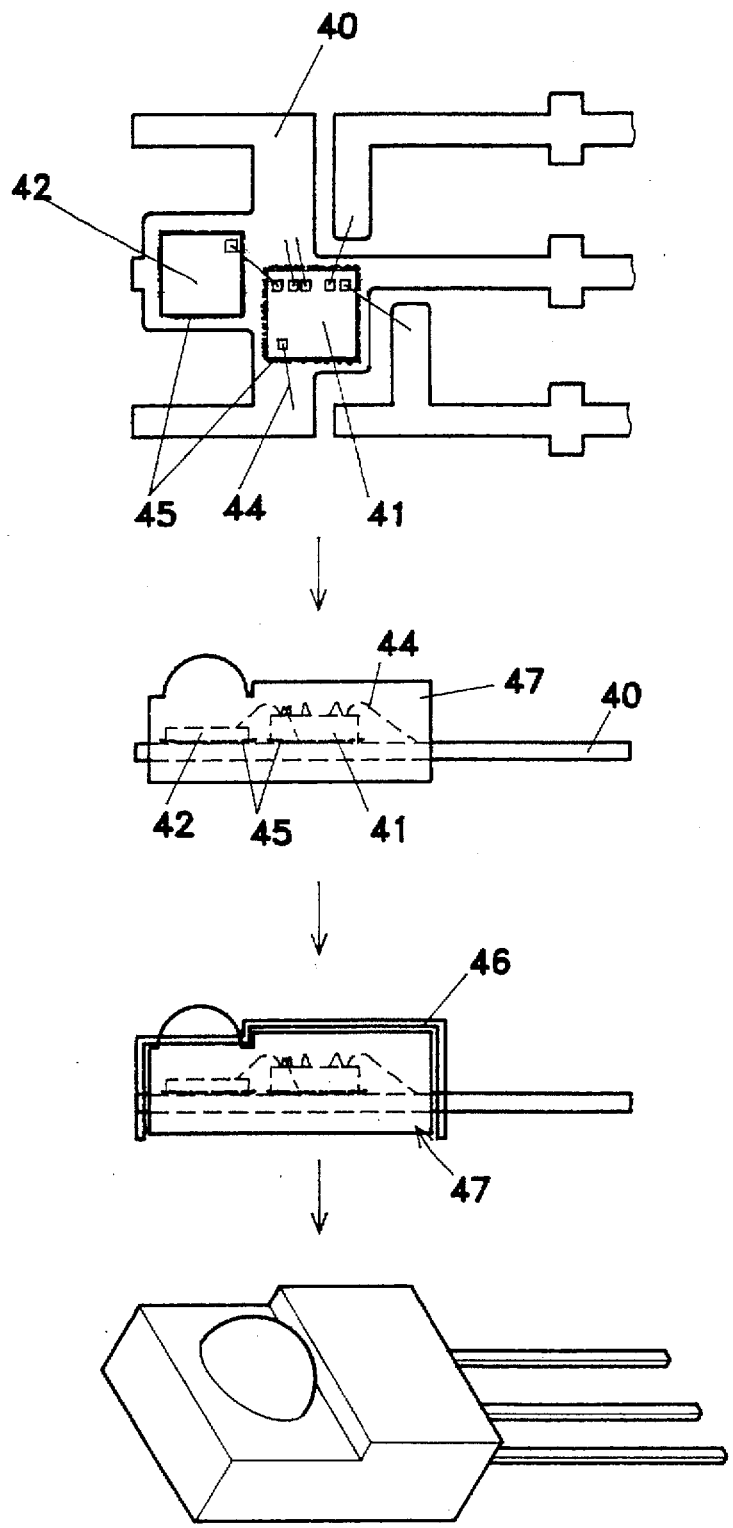
FIG. 8 is an infrared transceiver packaging flow chart according to the method of FIG. 7.
Figure 9:
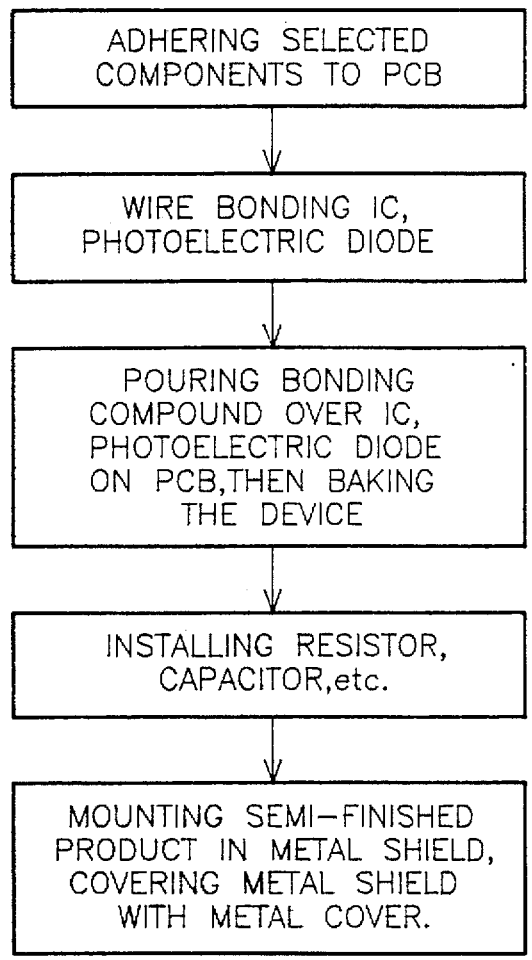
FIG. 9 is a block diagram showing an infrared transceiver packaging method from Sony.
Figure 10:
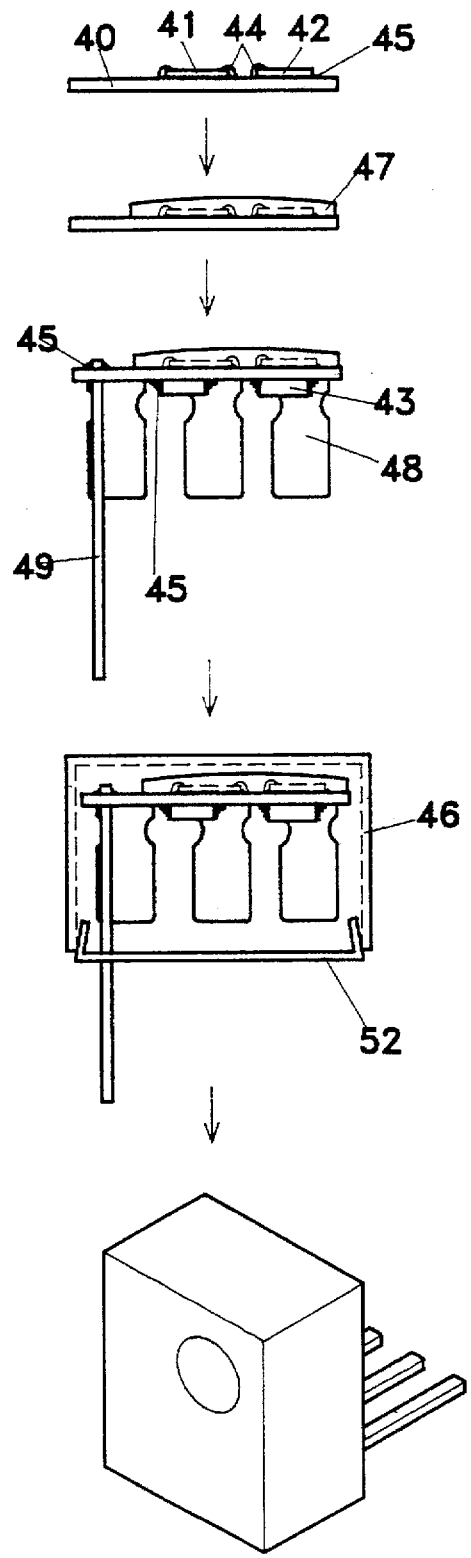
FIG. 10 is an infrared transceiver packaging flow chart according to the method of FIG. 9.

FIG. 3 shows an alternate form of the hardware for the infrared transceiver packaging method according to the present invention. According to this alternate form, the hardware is comprised of a substrate 40, a shielding case 46, and an insert mode die 50. The substrate 40 is mounted with an IC 41, a photoelectric element (photoelectric diode or transistor) 42, an infrared emitting diode 51, and a plurality of contact pins 49. The IC 41, the photoelectric element 42, the infrared diode 51, and the contact pins 49 are fastened to the substrate 40 with electrically conductive material 45 by bonding. The photoelectric element 42 is adapted to receive infrared signals. The infrared diode 51 is adapted to emit infrared signals. The substrate 40 can be made in the form of a rack, an open frame, or a printed circuit board. The shielding case 46 is mounted around the substrate 40, having a window 46a. The insert mode die 50 is filled up with a bonding compound 47. When the substrate 40 is mounted in the shielding case 46, the shielding case 46 is plugged into the bonding compound 47 in the insert mode die 50, and then processed into a finished product by means of a baking and mold stripping process.

It is to be understood that the drawings are designed for purposes of illustration only, and are not intended as a definition of the limits and scope of the invention disclosed. For example, an optical IC may be used with the aforesaid elements and mounted on the substrate.

What the invention claimed is:

1. An infrared transceiver package, comprising:

a substrate having infrared emitting and receiving elements mounted thereon;

a shielding case covering said substrate; and an insert mode die filled up with a bonding compound;

said shielding case and said substrate being inserted into the bonding compound in said insert mode die.

2. The infrared transceiver package as recited in claim 1 wherein said infrared emitting and receiving elements are adhered to said substrate by electrically conductive material.

3. The infrared transceiver package as recited in claim 1 wherein said infrared emitting and receiving elements are fastened to said substrate by surface mounting.

4. The infrared transceiver package as recited in claim 1 wherein said infrared emitting and receiving elements are connected to said substrate by wire bonding.

5. The infrared transceiver package as recited in claim 1 wherein said substrate is a rack.

6. The infrared transceiver package as recited in claim 1 wherein said substrate is an open frame.

7. The infrared transceiver package as recited in claim 1 wherein said substrate is a circuit board.

8. The infrared transceiver package as recited in claim 1 wherein said shielding case includes at least one window for transmitting and receiving infrared rays therethrough.

9. The infrared transceiver package as recited in claim 1 wherein said infrared emitting and receiving elements include an integrated circuit, a photoelectric diode, an infrared emitting diode, and a plurality of contact pins.

10. The infrared transceiver package as recited in claim 9 wherein said photoelectric diode and said integrated circuit form an optical integrated circuit.

11. The infrared transceiver package as recited in claim 1 wherein said infrared emitting and receiving elements include an integrated circuit, a photoelectric transistor, an infrared emitting diode, and a plurality of contact pins.

* * * * *